US007064946B2

United States Patent
Thiery et al.

(10) Patent No.: US 7,064,946 B2
(45) Date of Patent: Jun. 20, 2006

(54) ELECTRONIC FUSE

(75) Inventors: Vincent Thiery, Provence (FR); Bruno C. Nadd, Lourmari (FR); Chik Yam Lee, Courtaboeuf Cedex (FR)

(73) Assignee: International Rectifier Corporation, El Segundo, CA (US)

( * ) Notice: Subject to any disclaimer, the term of this patent is extended or adjusted under 35 U.S.C. 154(b) by 346 days.

(21) Appl. No.: 10/740,712

(22) Filed: Dec. 18, 2003

(65) Prior Publication Data

US 2005/0135037 A1   Jun. 23, 2005

(51) Int. Cl.
*H02H 9/02* (2006.01)
(52) U.S. Cl. .................. 361/93.1; 361/93.2; 361/93.4; 361/93.5; 361/93.6; 361/93.9; 361/96; 361/18; 361/100; 361/101; 361/94
(58) Field of Classification Search ............... 361/93.1, 361/93.2, 93.4, 93.5, 93.6, 18, 100–101, 361/94, 93.9, 96
See application file for complete search history.

(56) References Cited

U.S. PATENT DOCUMENTS 6,356,423 B1 * 3/2002 Hastings et al. ........... 361/93.2
6,831,821 B1 * 12/2004 Ohshima ..................... 361/86

* cited by examiner

Primary Examiner—Karl Easthom
Assistant Examiner—Robert T. Dang

(57) ABSTRACT

An electronic fuse comprising an integrated circuit having a control output terminal coupled to a control electrode of a power semiconductor switching device, the power semiconductor switching device being coupled in series with a load between first and second potentials, the integrated circuit further comprising a current sense input for sensing the current through the power semiconductor switching device, the integrated circuit further comprising a driver circuit for driving the power semi-conductor switching device, the driver circuit being coupled to a current limiting circuit responsive to the sensed current in the power semiconductor switching device, the current limiting circuit controlling the driver circuit whereby if the current through the power semiconductor switching device exceeds a predetermined threshold, the current limiting circuit generates a command to pulse the power semiconductor switching device on and off in a period of pulsed operation to maintain the current in the power semiconductor switching device below a predetermined level, further comprising a first timer circuit for limiting the period of pulsed operation to a preprogrammed first duration and further for controlling the power semiconductor switching device whereby if two commands to pulse the power semiconductor switching device are generated by the current limiting circuit within a duration less than a predetermined second duration, the power semiconductor switching device is turned off.

12 Claims, 14 Drawing Sheets

FIG. 3F
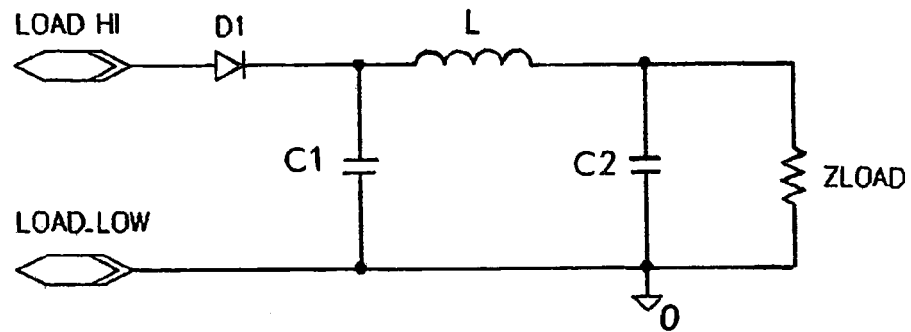
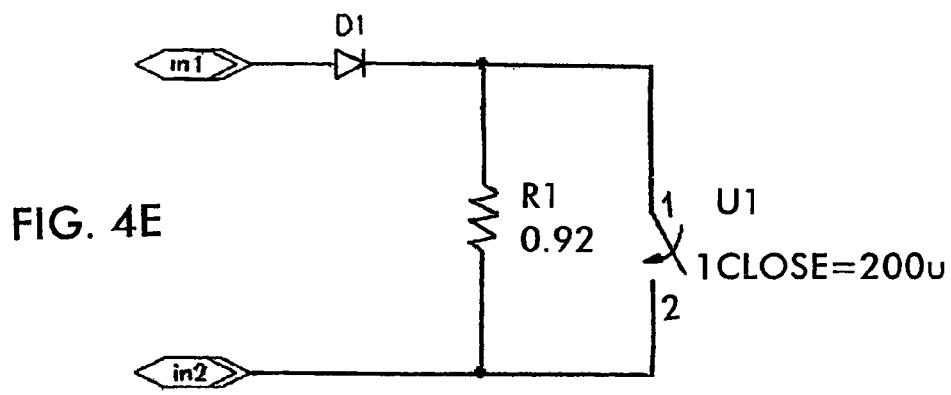
FIG. 4E
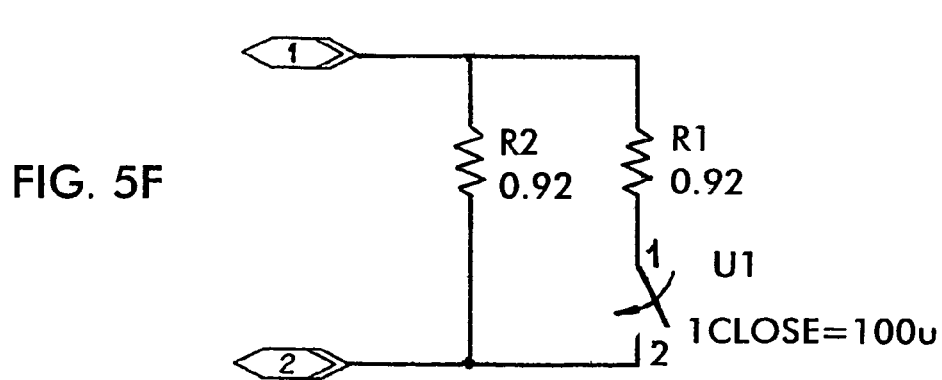
FIG. 5F

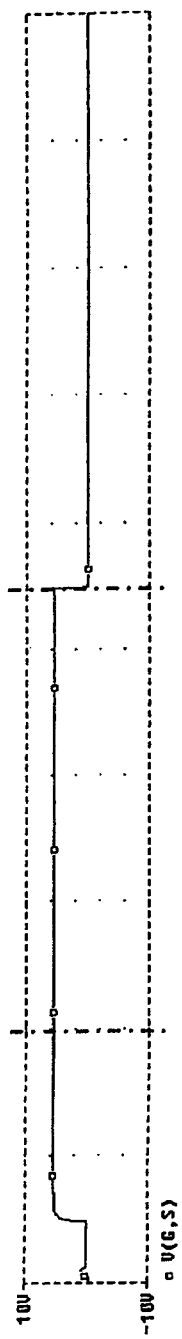
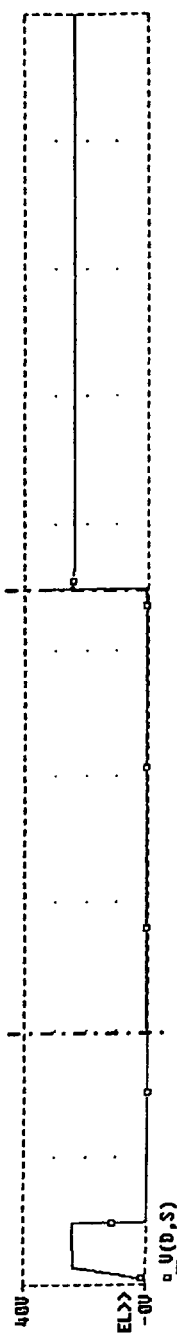
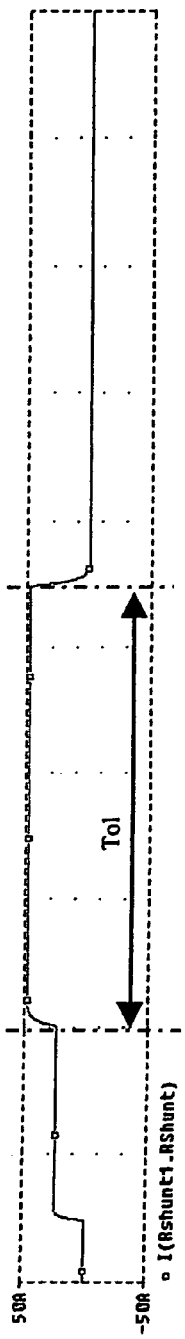
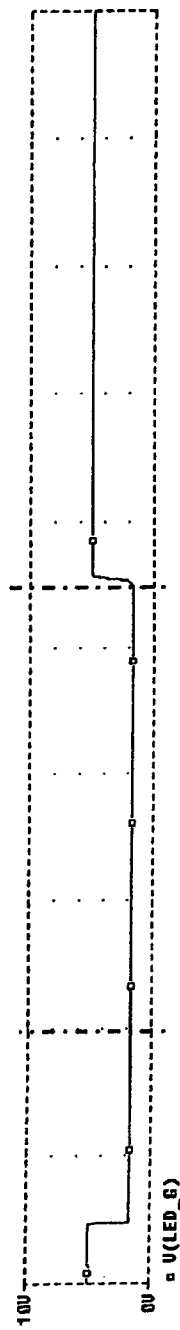
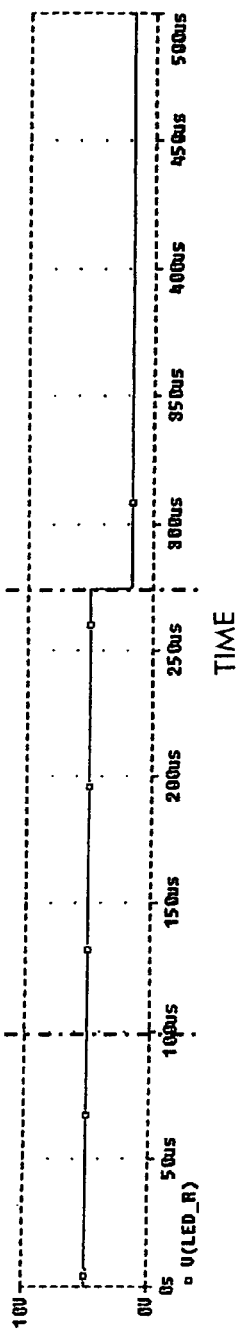
FIG. 5A
FIG. 5B
FIG. 5C
FIG. 5D
FIG. 5E

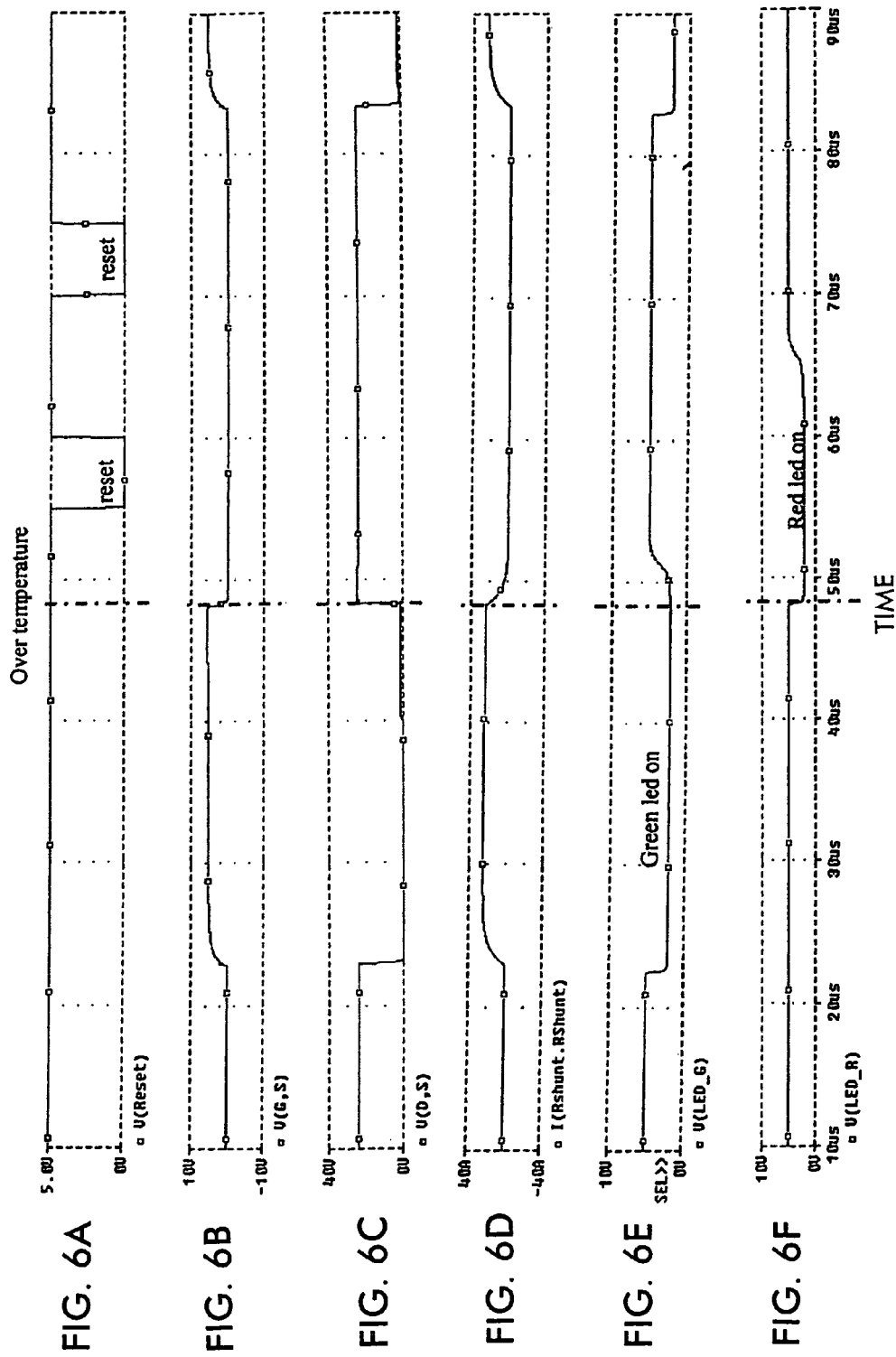

ELECTRONIC FUSE

BACKGROUND OF THE INVENTION

The present invention relates to an electronic fuse. In particular, the present invention relates to an electronic circuit which will act as an electronic fuse for a power semiconductor device in the event of excessive current through the semiconductor device.

U.S. Pat. No. 6,356,423 to Hastings et al. discloses a solid state protection circuit for electrical apparatus in which electrical equipment is safeguarded from damage due to faults by a circuit that provides several levels of protection. A semiconductor switch and a current sensor are placed in series with the electrical equipment. In a first mode of operation when the magnitude of current is less than a first threshold, the semiconductor switch is maintained in a continuous conductive state. In the second mode of operation when the magnitude of current is greater than the first threshold and less than a second threshold, the semiconductor switch is rendered non-conductive after a predefined period of time. In the third mode of operation when the magnitude of the current is greater than the second threshold, the semiconductor switch is alternately pulsed conductive and non-conductive to limit the current to the load to less than the second threshold. The circuit described also has a fourth mode of operation when the magnitude of current is greater than a third threshold that is greater than the second threshold whereby the semiconductor switch is rendered non-conductive until the apparatus is specifically reset.

In certain instances, the above described prior art device is inadequate. In particular, there are conditions wherein the pulsed mode of operation occurs where the semiconductor device may be damaged. The above described prior art device limits the amount of time in which the semiconductor device can be pulsed by counting the number of pulses. If the pulse count exceeds a predetermined count, the semiconductor device is rendered nonconductive.

However, the prior art device fails to address a circumstance where the pulsed mode does not exceed the predetermined count, and the semiconductor device again enters the continuous mode of operation and thereafter enters the pulsed mode again. It is not clear if the prior art circuit will trip the semiconductor device when the pulse count exceeds the predetermined pulse count or the pulse count starts anew upon the re-entry into the pulsed mode. In certain circumstances, it may not be desirable to trip the semiconductor device. Further, it may also be described to turn off the semiconductor device even through the pulse count has not been exceeded, but where the pulsed mode of operation is requested with insufficient duration between the requests for pulsed mode operation.

Accordingly, there is a need for an improved electronic fuse circuit that will appropriately protect the semiconductor switching device in the event of interrupted pulsed mode operation.

SUMMARY OF THE INVENTION

It is an object of the present invention to provide an improved electronic fuse and, in particular, an electronic circuit which simulates the operation of a thermal/mechanical fuse to prevent overloading of a power semiconductor switching device, but which can easily be reset by activating a button or switch.

It is further an object of the present invention to provide an electronic fuse that provides a pulsed mode of operation in the event of a certain overcurrent range, but yet which will protect the semiconductor device adequately in the event the pulsed mode of operation is interrupted but recurs.

The above and other objects of the invention are achieved by an electronic fuse comprising an integrated circuit having a control output terminal coupled to a control electrode of a power semiconductor switching device, the power semiconductor switching device being coupled in series with a load between first and second potentials, the integrated circuit further comprising a current sense input for sensing the current through the power semiconductor switching device and further comprising a driver circuit for driving the power semiconductor switching device, the driver circuit being coupled to a current limiting circuit responsive to the sensed current in the power semiconductor switching device, the current limiting circuit controlling the driver circuit whereby if the current through the power semiconductor switching device exceeds a predetermined threshold, the current limiting circuit generates a command to pulse the power semiconductor switching device on and off in a period of pulsed operation to maintain the current in the power semiconductor switching device below a predetermined level, further comprising a first timer circuit for limiting said period of pulsed operation to a preprogrammed first duration and further for controlling the power semiconductor switching device whereby if two commands to pulse the power semiconductor switching device are generated by the current limiting circuit within a duration less than a predetermined second duration, the power semiconductor switching device is turned off.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

Figure 3A:
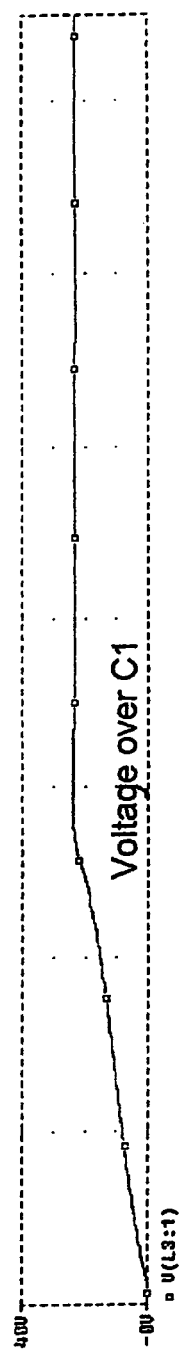
Figure 4A:
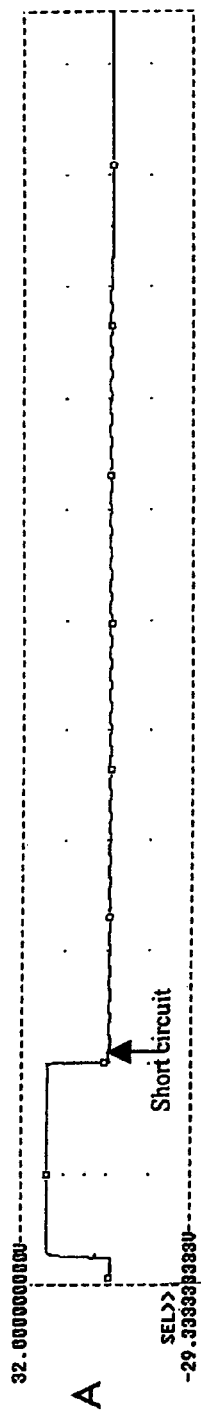
Figure 4B:
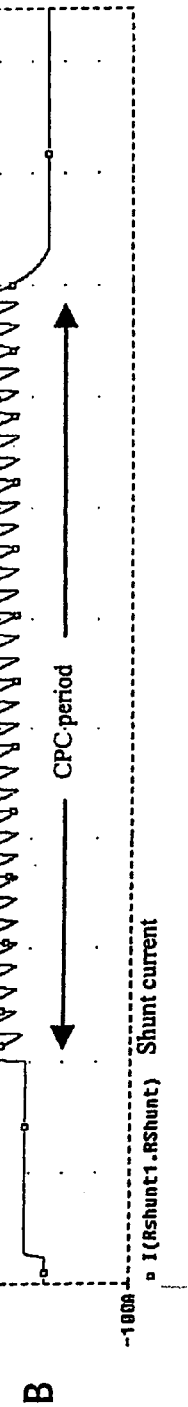
Figure 4C:
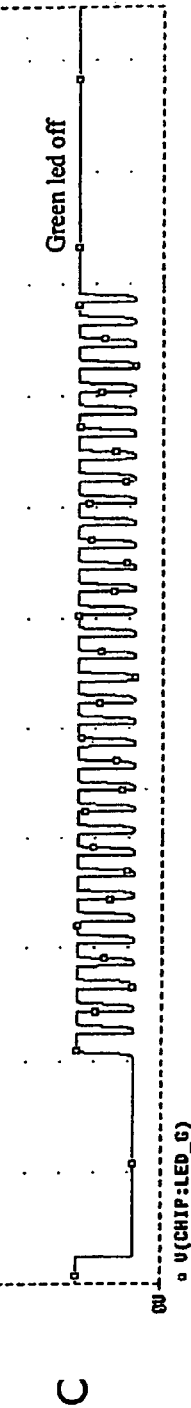
Figure 4D:
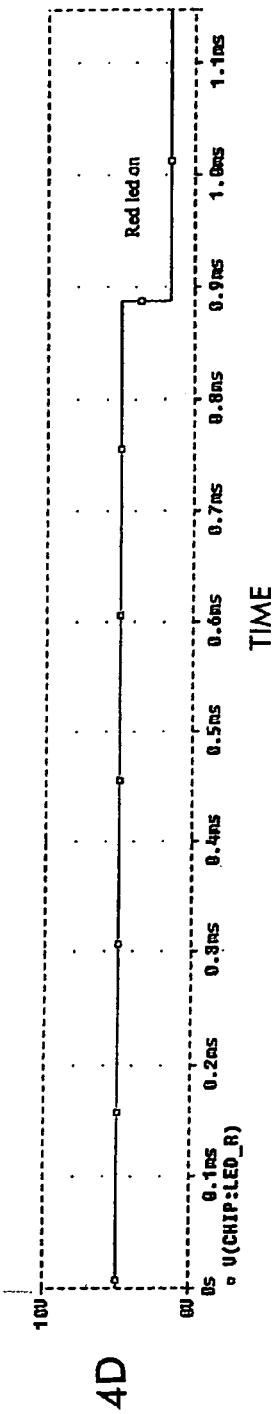
Figure 7A:
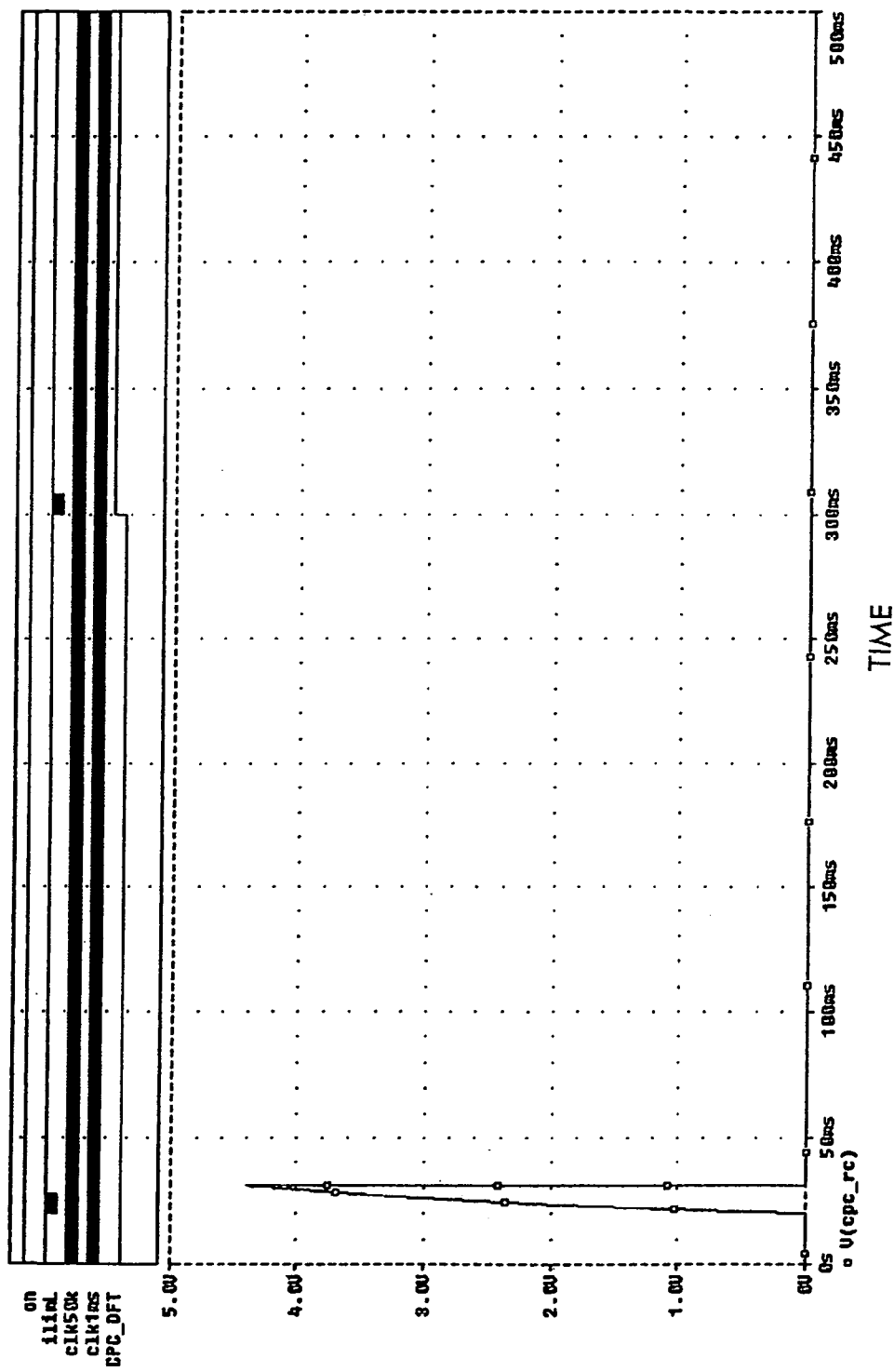

FIGS. 3A, B, C, D and E are waveforms showing operation of the electronic fuse of the present invention in response to a typical load;

FIG. 3F shows a test circuit for a typical load;

FIGS. 4A, B, C and D shows the response of the circuit of the present invention to a short circuit;

FIG. 4E shows a test short circuit load;

FIGS. 5A, B, C, D and E shows the response of the present invention to an overload;

FIG. 5F shows a test overload;

FIGS. 6A, B, C, D, E and F shows waveforms in response to a reset operation;

FIGS. 7A, B and C show operation in the CPC (Current pulse control) mode.

Figure 8A:
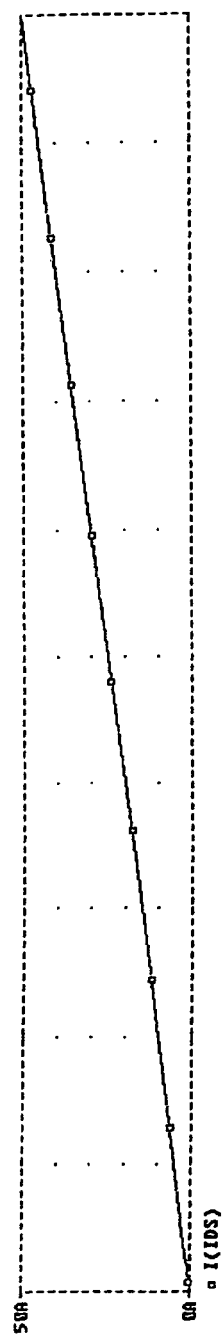
Figure 8B:
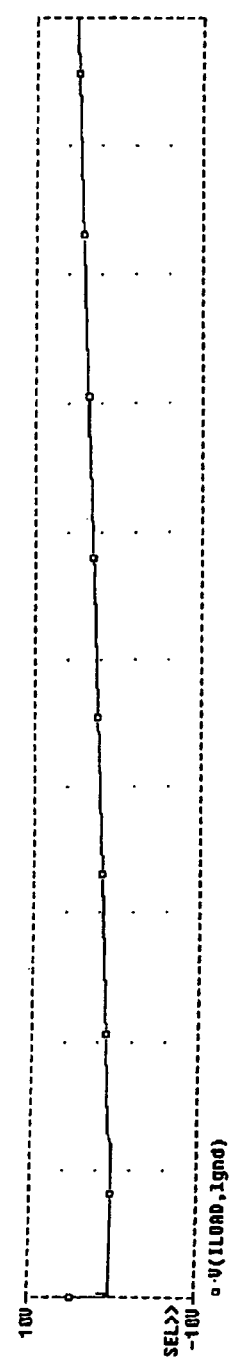

FIGS. 8A, B, C and D show operation of the current overload circuit; and

Figure 9:
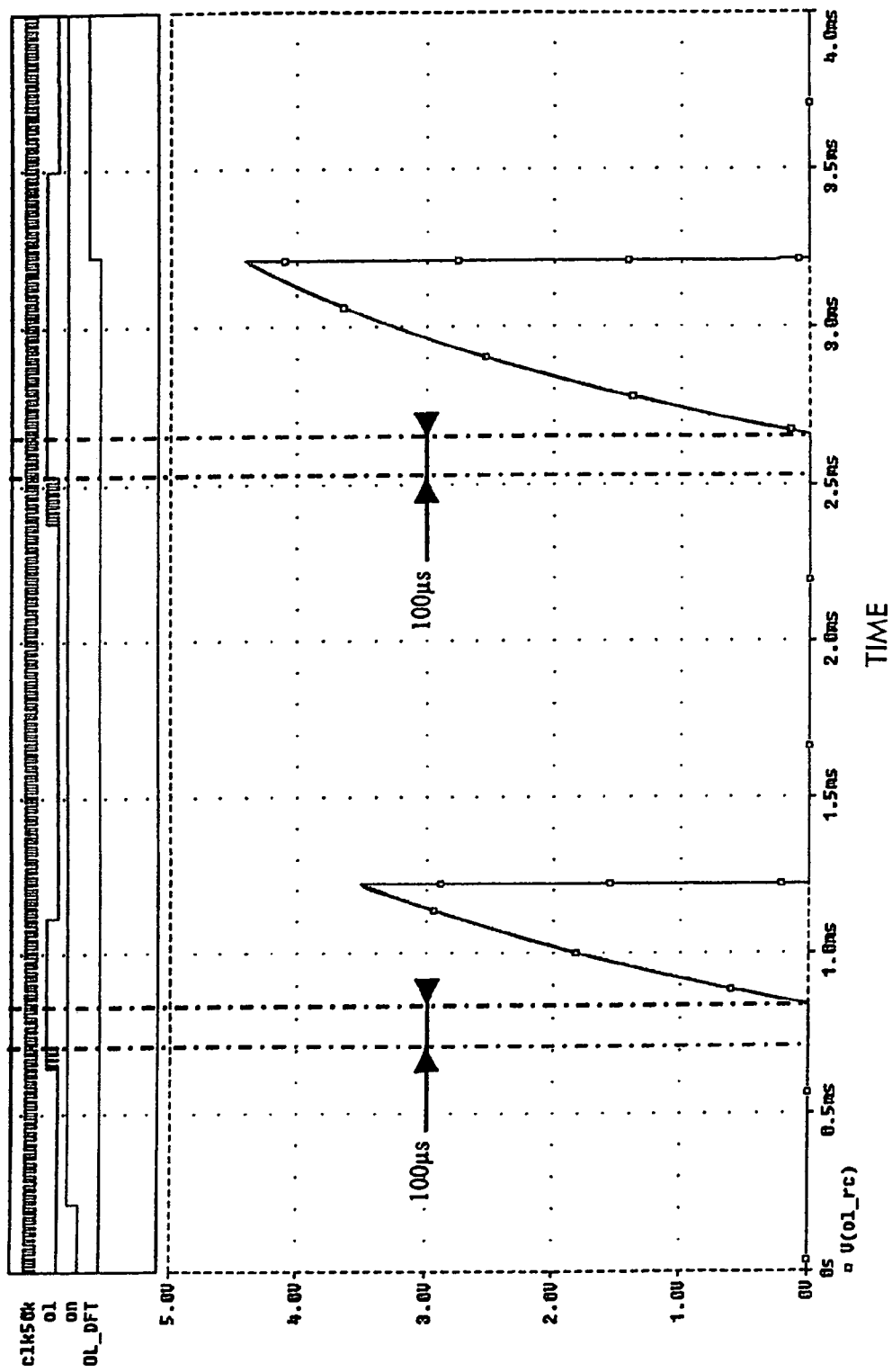

FIG. 9 shows waveforms illustrating operation of the overload timer.

DETAILED DESCRIPTION OF THE INVENTION

Figure 1:
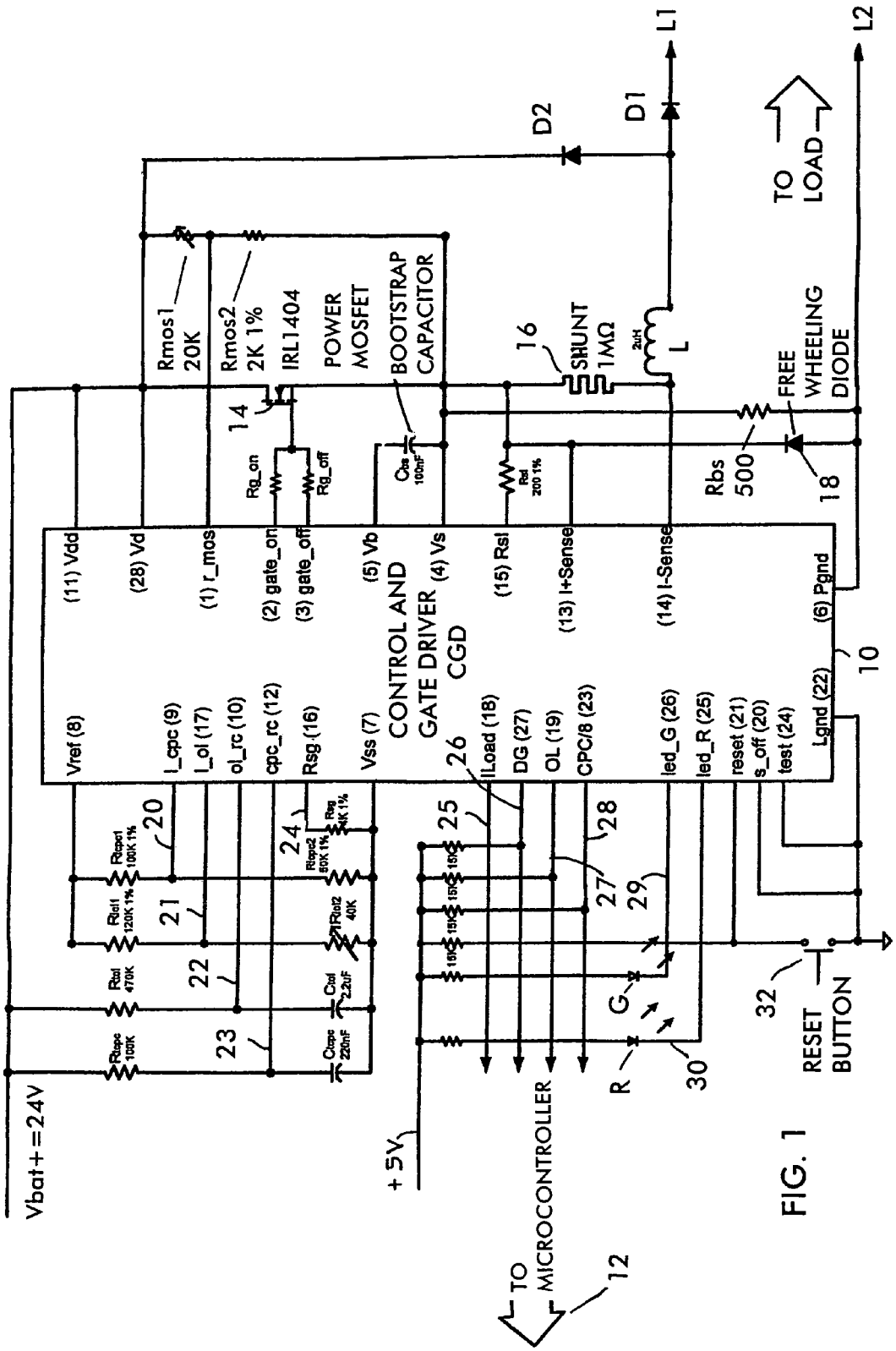
FIG. 1 shows the electronic fuse of the present invention which comprises a control and gate driver (CGD) integrated circuit for protecting a power MOSFET device.

With reference now to the drawings, FIG. 1 shows the electronic fuse of the present invention. The electronic fuse of the present invention comprises a control and gate driver (CGD) integrated circuit 10 which can provide outputs to a monitoring micro-controller as indicated at 12. The integrated circuit 10 includes a number of input and output terminals including a reference voltage Vref, supply voltages Vdd, Vd, Vss and logic ground Lgnd and power ground Pgnd. Also provided are outputs gate-on and gate-off for driving the power MOSFET 14. Terminal Vb is for a bootstrap capacitor Cbs coupled between Vb and Vs, the low side of the semiconductor switch 14. Current sensing inputs I+sense and I−sense and a terminal Rsi are provided, a resistor Rsi being disposed between input Rsi and I+sense. A shunt resistor 16 of about 1 mohm ($10^{-3}$ ohm) is disposed between I+sense and I−sense. The load is connected in series with an inductance L and diode D1 across points L1 and L2. A freewheeling diode 18 is coupled in series with the MOSFET 14 to power ground Pgnd. A bootstrap charging resistor Rbs is coupled between Vs and Pgnd. A diode D2 is coupled across the FET 14, shunt 16 and inductor L to provide transient protection. Resistors Rmos 1 and Rmos 2 are provided coupled across the FET 14 for programming an over-temperature threshold.

A number of terminals 20, 21, 22, 23 and 24 are provided coupled to timing resistors and capacitors as shown for providing timing functions for the IC internal circuits. In addition, a number of sensor outputs 25, 26, 27 and 28 are provided to the micro-controller 12. These outputs include load current Iload, diagnostic (DG), overload (OL) and CPC/8 (gate signal÷8). Outputs 29 and 30 are provided to light up a green and red LED, respectively, the red LED indicating when the MOSFET 14 has been turned off due to a detected fault and a green LED indicating that the MOSFET is conductive and there is no fault. Further, a reset button 32 is provided for resetting the circuit in the event of an overload or other fault that has turned the FET 14 off.

Figure 2:
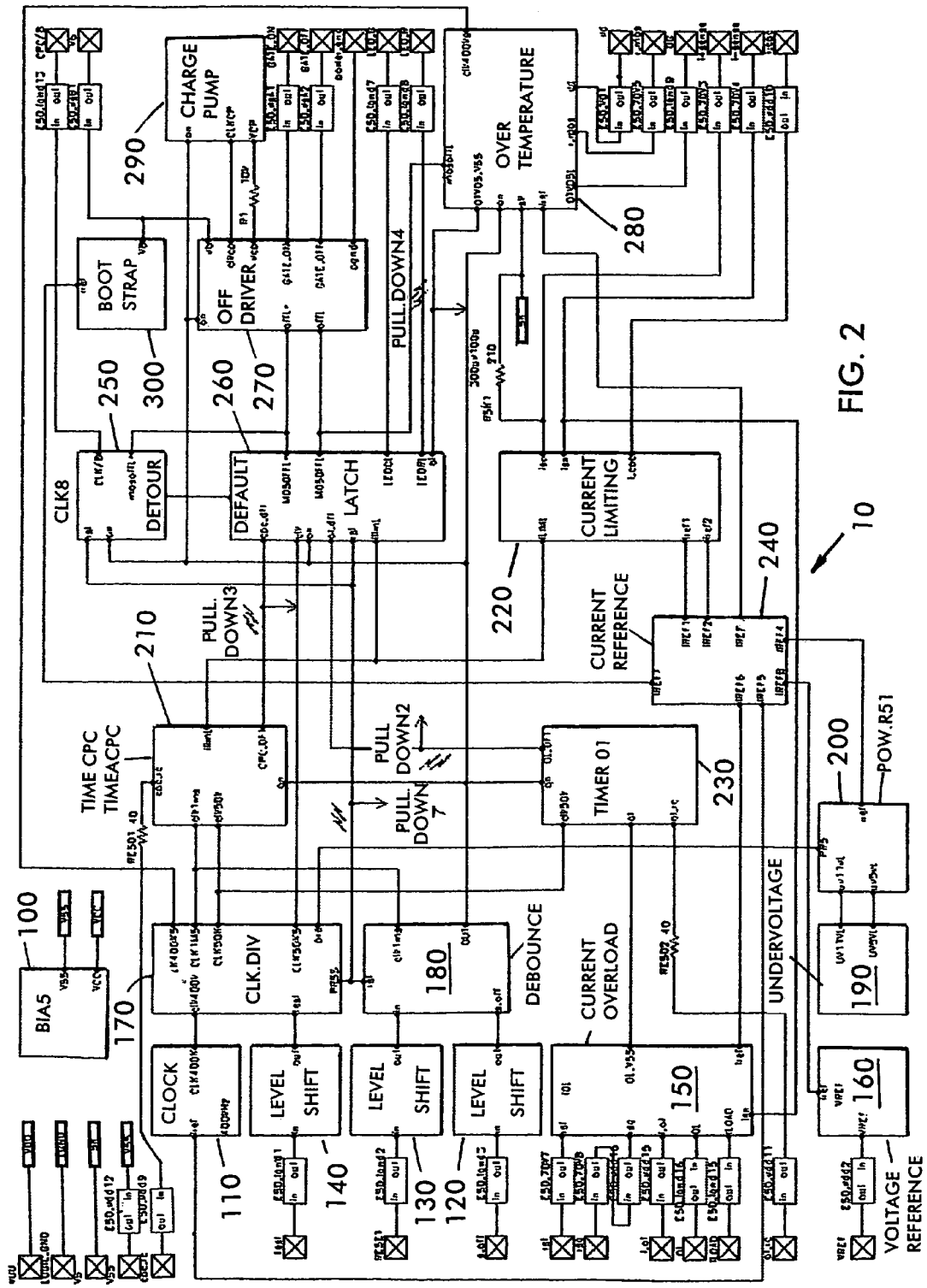
FIG. 2 is a functional block diagram of the integrated circuit of FIG. 1.

FIG. 2 is a functional block diagram of the integrated circuit. With reference to FIG. 2, the integrated circuit 10 comprises a number of basic blocks including bias stage 100 which provides regulated reference voltages, clock 110 which provides a local 400 khz oscillator signal, IN_LSI (120) which functions as a level shifter from ground to Vss for the S-off pin, IN_LS2 (130) which functions as a level shifter from ground to Vss for the reset pin and IN_LS3 (140) which functions as a level shifter from ground to Vss for the test pin. In addition, an IOL circuit 150 functions as a current overload detector. The test and s-off pins are provided for diagnostic purposes and are normally coupled to logic ground in typical application. See FIG. 1.

A circuit Vref 160 functions as a band gap voltage regulator.

The output of the clock 110 is provided to a clock divider circuit CLK DIV (170). A debounce circuit DB (180) is provided for debouncing the reset push button.

Circuit UV 190 functions as a power supply under voltage supervisor and circuit POW_RST (200) functions as a power on reset to reset functions upon power on.

Circuit TIMER CPC (210) functions as a programmable timer for controlling the current limiting circuit ILIM (220). In addition, a programmable overload timer, TIMER_OL (230) is provided for controlling the period of time that an overload will be tolerated.

Constant current references are provided by circuit IREF (240). Circuit CLK8 (250) provides a MOSFET gate signal divided by eight (CPC/8) based upon the output of CLK_DIV.

The circuit identified as LATCH 260 is a central latch provided for latching the desired operation of the MOSFET 14, including CPC (current pulse control) operation. Outputs from latch 260 are provided to power MOSFET driver DR 270. Circuit 270 provides GATE ON and GATE OFF outputs which are provided to turn on and off the power MOSFET 14. In addition, an over-temperature protection circuit OT 280 is provided for over-temperature protection. It has inputs r-mos and Vd and an output DG provided for diagnostics.

A charge pump CP (290) is provided for producing voltages greater than the supply voltage and a bootstrap circuit BS 300 provides a bootstrap voltage across an external bootstrap capacitor.

Turning now to each of the basic blocks, bandgap voltage reference 160 generates a 2.5 volt voltage reference and includes a comparator with a threshold voltage determined by a thermal-voltage (kT/q) and the base-emitter voltage of a transistor. As the base-emitter voltage decreases with temperature, the thermal-voltage increases with temperature, and a weighted addition of these two voltages will create an output voltage that is independent of temperature variation.

Current reference IREF 240 provides regulated current references for the entire integrated circuit.

The circuit BIAS 100 generates two regulated voltages Vss, which is equal to Vdd−6.7 volts and Vcc which is 6 volts above logic ground.

Circuit UV (under-voltage protection) 190 detects if the power supply voltage is too low. It has two output voltages UV11VL and UV5VL. UV11VL goes low if the power supply voltage VDD goes below 11 volts and UV5VL goes low if VDD−DSS goes below 4.5 volts. If either of these outputs goes low, the integrated circuit is shut down. The under-voltage block 190 is comprised of two sub-circuits: an under-voltage circuit adjusted to 11 volts to ensure that the power supply voltage is high enough and an under-voltage circuit adjusted to 5 volts to ensure that the internal power supply voltage VDD−VSS is high enough to power the IC. When the power supply voltage rises, the output signal UV11VL goes from 0 to 1 for a power supply voltage equal to 11 volts. When the power supply fails, the output signal goes from 1 to 0 for a power supply voltage equal to 10 volts, thereby providing hysteresis. For the signal UV5VL, a fraction of the logic power supply voltage VDD−VSS is compared with a temperature independent voltage reference. A feedback loop creates hysteresis depending on whether the voltage is rising or falling. When the logic supply voltage rises, the output signal goes from 0 to 1 for a power supply voltage equal to 4.5 volts. When the power supply falls, the output signal goes from 1 to 0 for a power supply voltage equal to 4.2 volts. Both signals UV11VL and UV5VL are by default tied to low level.

Power ON reset 200 generates a power-on reset signal that resets all the logic circuits on power on. It remains high for a delay of about 700 microseconds even after no under voltage is detected. When the signals UV5VL and UV11VL are low, an under voltage has been detected. Input Iref provides a current reference and the output PRS, when high, indicates that a power ON reset is occurring.

Clock 110 provides an oscillator 400 khz square wave signal referenced to VSS. The circuit is based upon the charging and discharging of an RC circuit.

Clock divider 170 generates and synchronizes the different logic signals and clocks used in the integrated circuit. It is comprised of a counter that divides the 400 Khz clock input signal. Clock DIV 170 generates a number of lower frequency clock signals from the basic 400 Khz input clock frequency.

Circuit CLK8 250 divides the MOSFET gate state by 8. The CLK/8 output is equal to the MOSOFFL signal divided by 8 when the signal ON equals 1, default equals 0 and rst (reset) equals 0. Otherwise, the output is tied to a high logic level. The CLK/8 output is referenced to ground and is driven by an open collector transistor. Due to internal ESP protection, the output high level will never be higher than 6 volts. The CLK/8 output can be monitored by a supervising microcontroller.

Level shifts 120, 130 and 140 are provided to shift an input signal reference to ground to an output signal referenced to VSS for terminals test, RESET and s_off. VSS is an internal reference voltage which is equal to power supply voltage VDD−6 volts.

Circuit DB 180 is a debouncing circuit which eliminates bouncing or noise in the external push button signal. The output signal changes state only if the input signal stays at least 5 msecs at the same logic level.

Charge pump circuit CP 290 generates a voltage which is higher than the power supply voltage in order to drive the external MOSFET gate. When the ON input signal is low, the two ouptut signals are tied to VDD. The ON input signal switches the charge pump on and off. The charge pump circuit includes a ring oscillator and two charge pumps. The two charge pumps work alternatively with the clock. When the signal CLKCP is high, a capacitor will be charged to a voltage VDD−VSS equal to 6 volts. When the clock goes low, one end of the capacitor that was connected to VSS is tied to VDD and the other end of the capacitor is pushed to a voltage of VDD+6 volts. This voltage is used to drive the gate of the external MOSFET 14 via the driver circuit 270.

Bootstrap circuit BS 300 supplies a regulator voltage of 8 volts to charge the external bootstrap capacitor. It provides an 8 volt regulated voltage referenced to VS.

Gate driver DR 270 drives the gate of the external MOSFET 14. There are two outputs, a GATE_ON output and a GATE_OFF output. The GATE_ON output drives the GATE_ON and the gate OFF output drives the gate off. The circuit is comprised of three level shifters and a main driver. The main driver is connected to the source of the power MOSFET which functions as a reference voltage. Since the source can swing from power ground (Pgnd) to VDD which is equal to 24 volts, the main driver can be controlled by the signal from VDD when it is near ground and vice versa. The level shifter thus creates two signals, one from VDD and one from ground to control the main driver. Normally, the main driver is on all the time unless an off signal is sent to it.

Two gate pins GATE_ON and GATE_OFF are used because the switching times depend on gate resistances. Alternatively, a single output for driving the gate can be provided.

Latch 260, depending on the states of the different default signals that are generated by the rest of the integrated circuit, sends signals to the driver 270 to turn the MOSFET 14 on or off. The latch circuit includes the following inputs:

ol_dft—Overload default signal;

cpc_dft—CPC default signal;

otvds—over temperature or VDS too high signal;

clk—50 khz clock signal;

on—when high, turn on the MOSFET;

ilimL—when low, the current is higher than the current limiting threshold;

rst—power on reset.

The latch circuit also has the following outputs:

DEFAULT—high if any default is detected;

MOSOFFL—when low, turn the MOSFET off;

MOSOFFL*—logical complement of MOSOFFL;

LEDGL—when low, the MOSFET is on and green LED is lit;

LEDRL—when low, it indicates that default is detected and red LED is lit;

LEDGL is connected to an LED, preferably green, to indicate that the MOSFET is on and LEDRL is connected to a red LED to indicate that a default has occurred.

The DEFAULT output signal rises if one of the three default input signals is set and at the same time this output is level shifted to control the external LED. The MOSOFF output signal is synchronized with the 50 Khz clock and is latched. If any default occurs when the circuit is supposed to be on, the MOSOFF output signal falls and it is level shifted in order to connect to the external LED.

The current limitation circuit ILIM 220 generates an output signal when the current load reaches a programmed value indicating that a CPC (current pulse control) period is required. A CPC period is needed when the current through the shunt 16 exceeds a preprogrammed value. When a CPC period is required, the MOSFET 14 is pulsed on and off to limit the current. Output ILIML, when low, indicates that the current limitation threshold is exceeded. Circuit ILIM has inputs connected to I+sense and I−sense which are connected across the shunt resistor 16. It further has inputs iref 1 and ref 2 connected to current references. Additionally, input i_cpc is provided for programming the current limiting value.

Figure 2A:
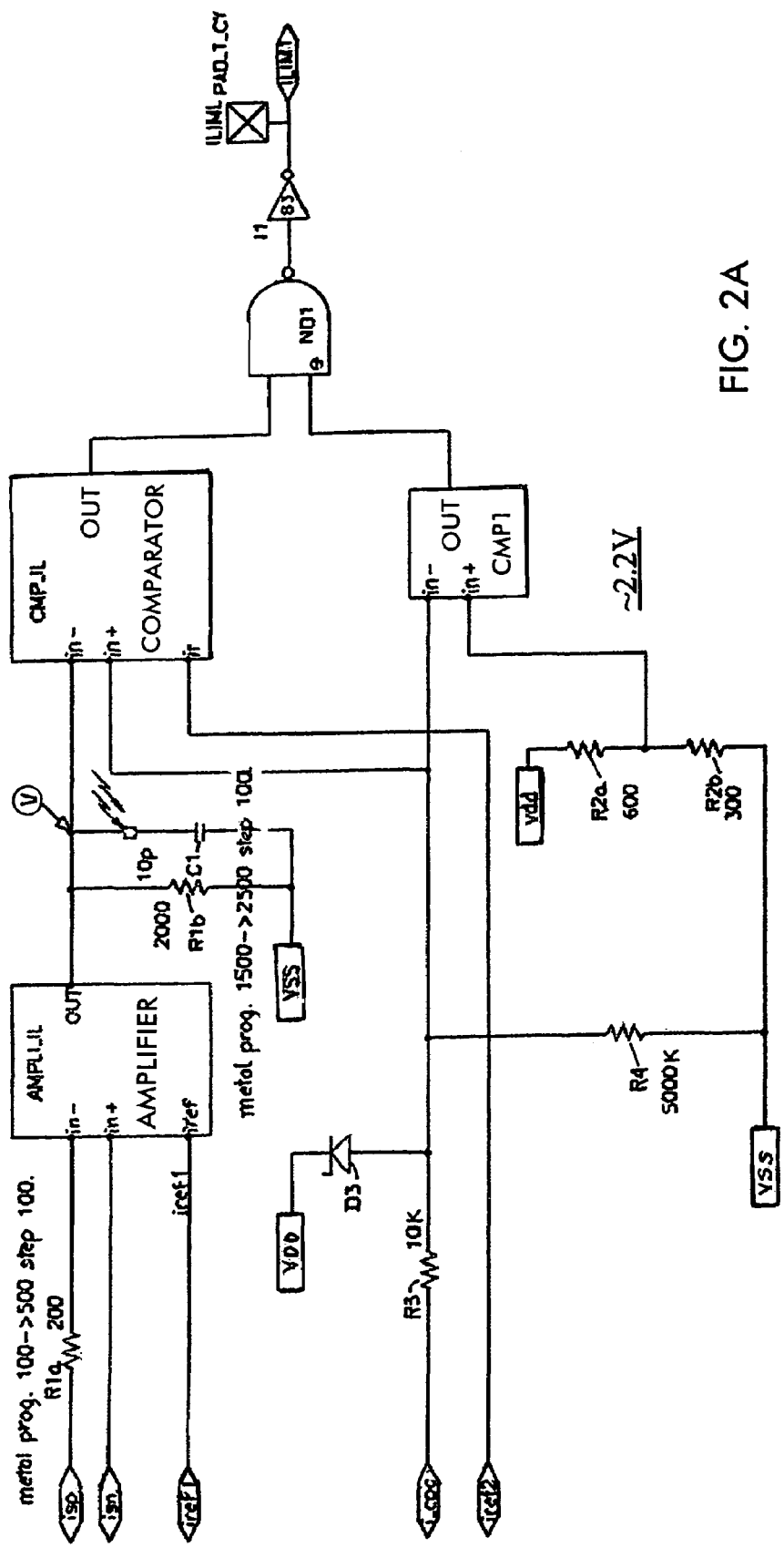
FIG. 2A is a block diagram of the current limiting of block of FIG. 2.
Figure 2B:
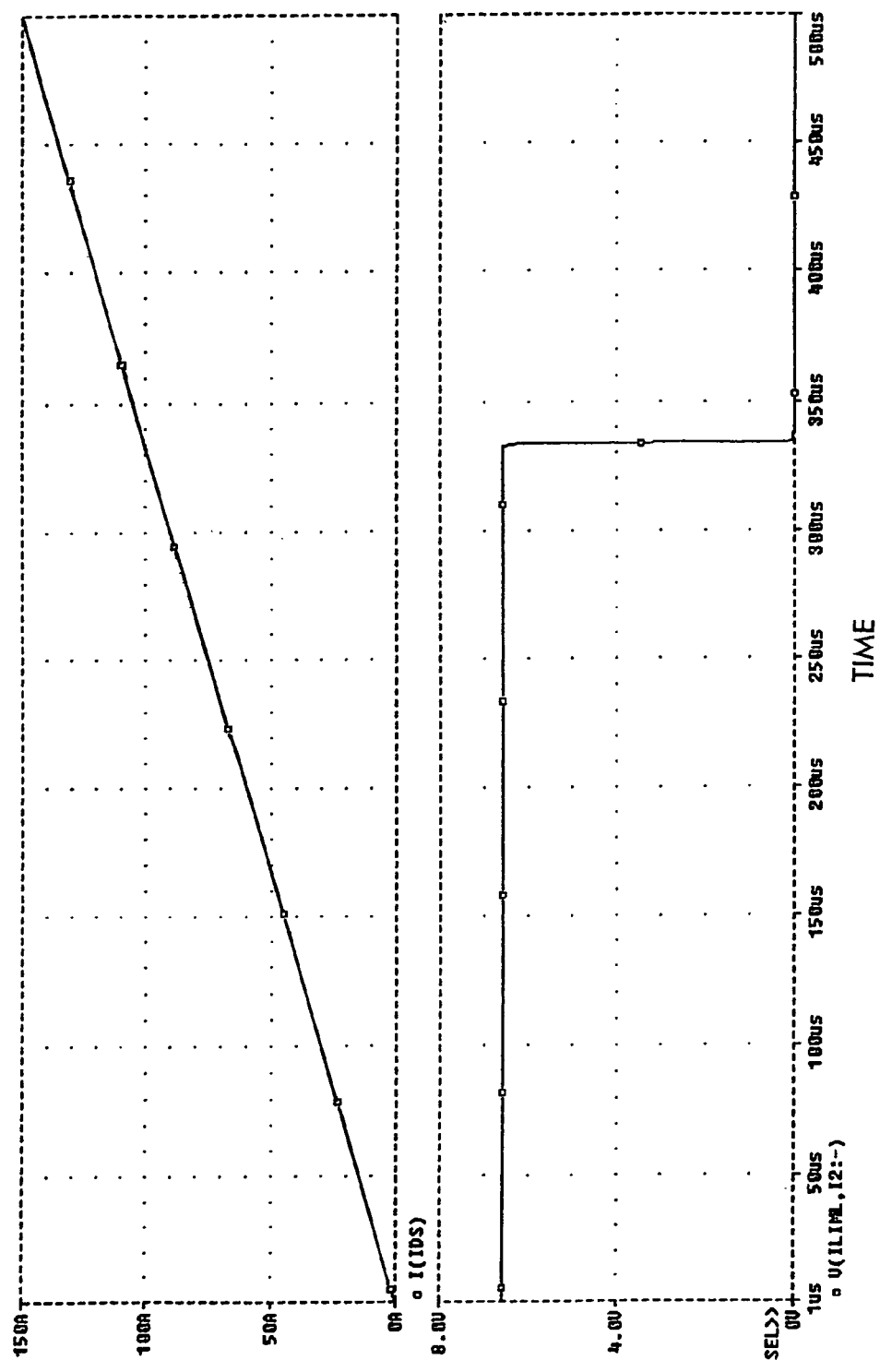
FIG. 2B shows waveforms illustrating operation of the current limiting block.

FIG. 2A shows details of the current limiting circuit. It uses an amplifier AMPL_IL which amplifies the voltage across the shunt. Its gain is R1$b$/R1$a$. The output is compared to an external programmable value i_cpc via a comparator CMP_IL. If the signal exceeds the programmable value i_cpc, an output is provided by the comparator which is provided to a NAND gate ND1 whose output is inverted by inverter I1. A second comparator CMP1 compares the level i_cpc to a voltage reference of approximately 2.2 volts. If i_cpc is greater than 2.2 volts, the output from this comparator will be high enabling the NAND gate. If the load current goes higher than the programmed threshold, ILIML goes low and CPC operation occurs as will be explained in greater detail below. If the i_cpc pin is floating, the ILIML output signal is tied to the low level default.

The CPC timer circuit 210 generates a default output signal if the duration of the CPC mode exceeds an externally set programmable time. In order to allow the MOSFET 14 to cool down, the block immediately sets a default signal cpc_dft high if two CPC modes are requested within a duration of less than 400 msec.

Timer CPC 210 has a 1 msec input clock clklms an input ilimL, the latter which, when low, means that the current is higher than the current limitation threshold. An input on when high is a command to turn the MOSFET ON and cpc_rc is an externally RC programmable pin for programming the externally programmable time. The output CPC_DFT indicates that a CPC default has occurred.

Figure 7B:
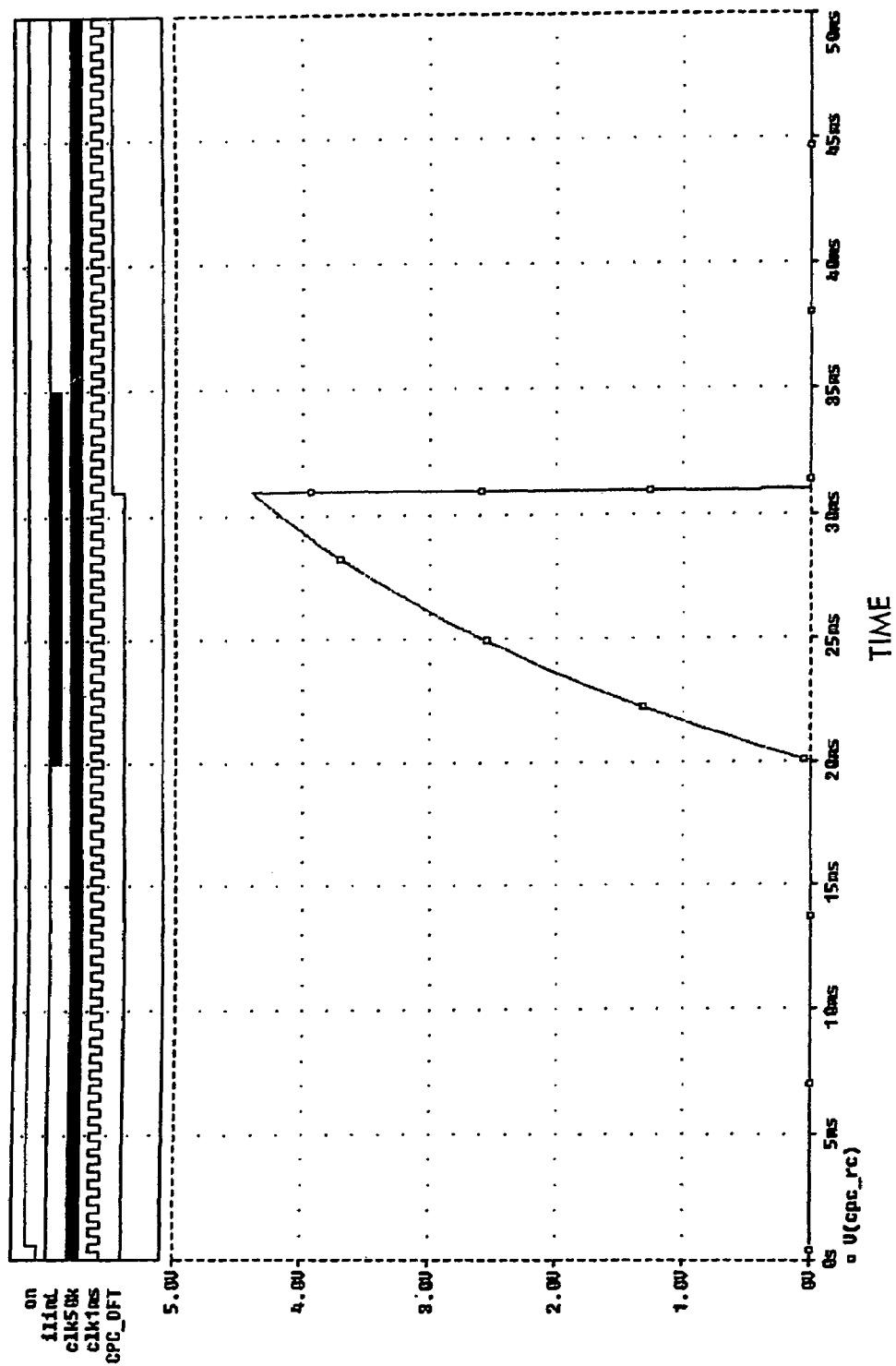
Figure 7C:
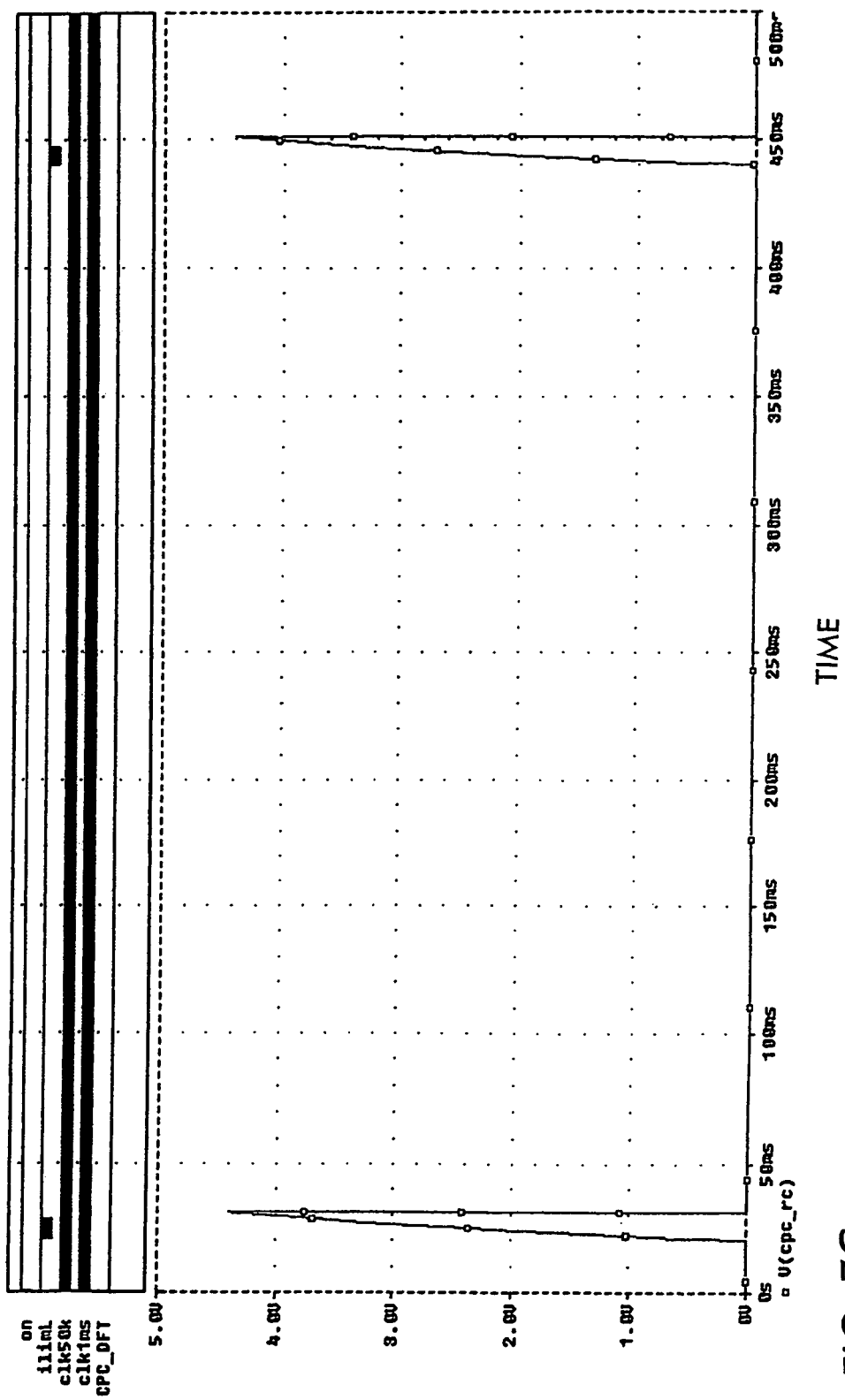

If two CPC periods are separated by time less than 400 msec, as shown in FIG. 7A, the default signal CPC_DFT will go high. This will be latched by the latch 260, turning the MOSFET 14 off. If one CPC period is longer than the external RC programmed time, the output CPC_DFT will also go high, turning the MOSFET off. This is shown in FIG. 7B. If two CPC periods are separated by more than 400 msec, the output CPC_DFT will remain low. This is shown in FIG. 7C.

Figure 8C:
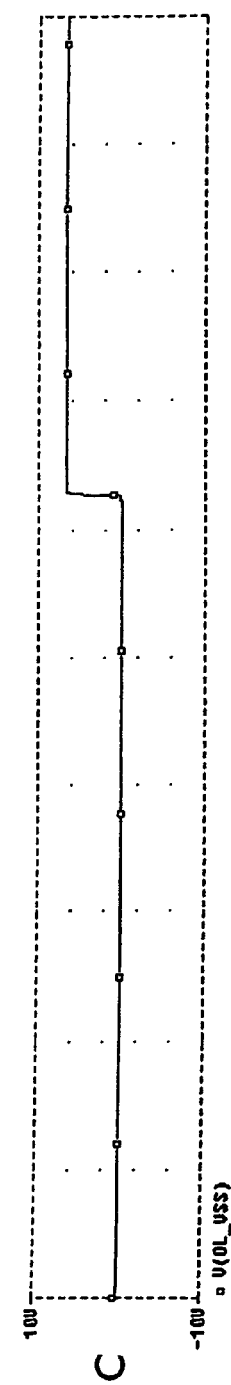
Figure 8D:
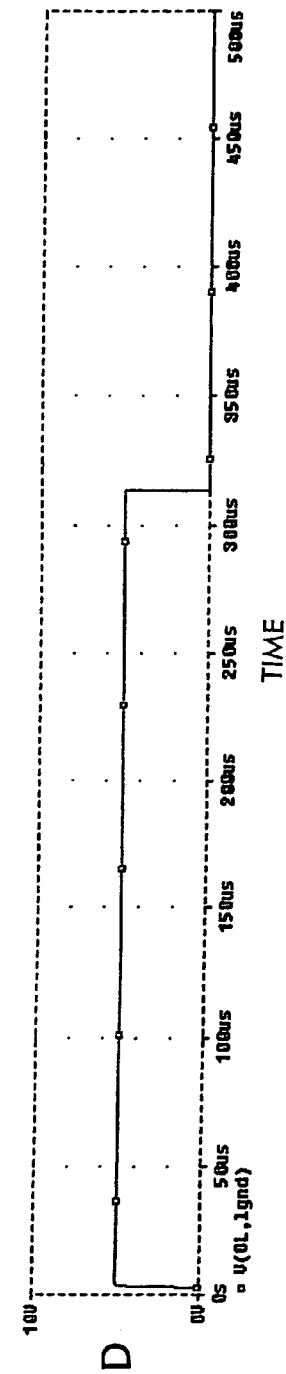

Current overload circuit IOL(150) generates an output signal OL that flags the overload for the supervising microcontroller when the load current reaches a programmed value. It also generates a voltage output LOAD that represents the load current. Output OL when low indicates that an overload has been detected. When the load current Ids reaches the threshold, the output OL goes high. An overload threshold programming i_ol is provided. If i_ol is floating, the current limiting block generates a default tying OL-VSS output signal to the high level. This is shown by the waveforms of FIG. 8. FIG. 8A shows a linearly increasing D-S current. FIG. 8C shows that an overload is sensed at about 30 A. At this time, OL_VSS goes high.

Overload timer 230 generates a fault logic output signal if an overload is detected and exceeds a programmed time. It includes input cpc_rc for programming, clklms which is a 1 msec period clock, ckL50k which is the 50 Khz clock, input ol which, when high, indicates that an overload is detected and an output OL_DFT which confirms the overload default.

OL_DFT is reset only if the on input is low which will happen if the external reset button is pushed or if there is a power on reset.

Over-temperature and VDS protection is provided by circuit 280. This circuit detects if the external MOSFET 14 is too hot or if the voltage between the drain and source of the MOSFET is too high while on. It includes outputs OTVDS-VSS which drives the gate on and OTVDSL which drives the gate off. The circuit has the following inputs: on indicates that a command to turn on the MOSFET has been requested; iref is a current reference; MOSoffL, which when low, commands the driver to turn off the MOSFET; Vd, the drain of the MOSFET; sk, the source of the MOSFET; r-mos, a pin connected to external resistors to program an over temperature threshold; and clk400ks a 50 Khz clock signal with 2.5 usec duty cycle.

FIG. 3A-3E show operation of the circuit with a typical load, shown in FIG. 3F where C1 equals 1000 uF, L equals 1.5 mH, C2 is 500 uF and Z load equals 0.92 ohms. A typical load would have C1=6500 uF, but this has been reduced to reduce the shown simulation time.

Figure 3B:
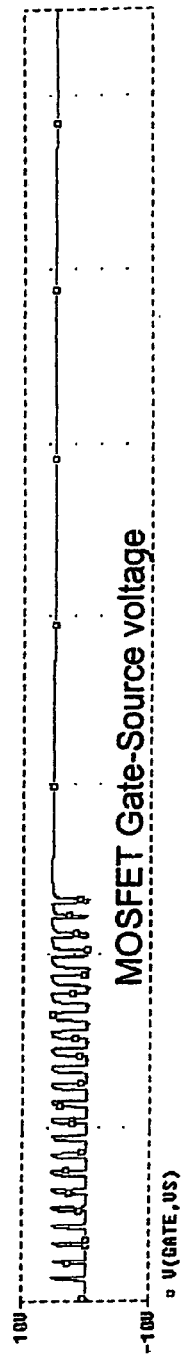
Figure 3C:
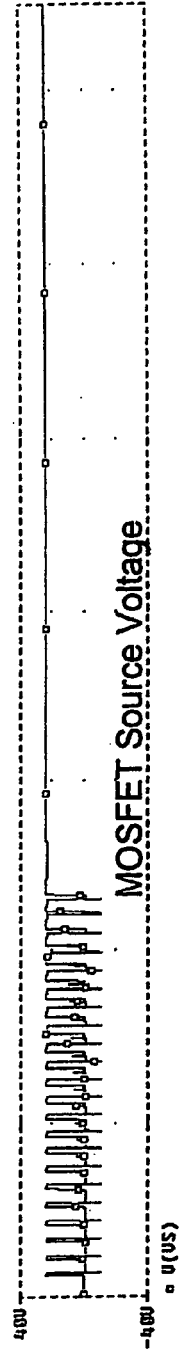
Figure 3D:
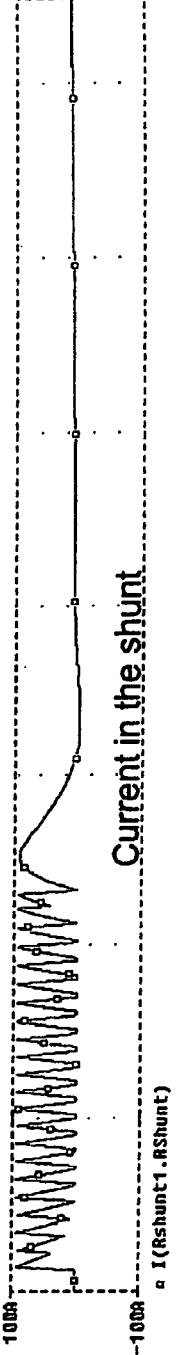
Figure 3E:
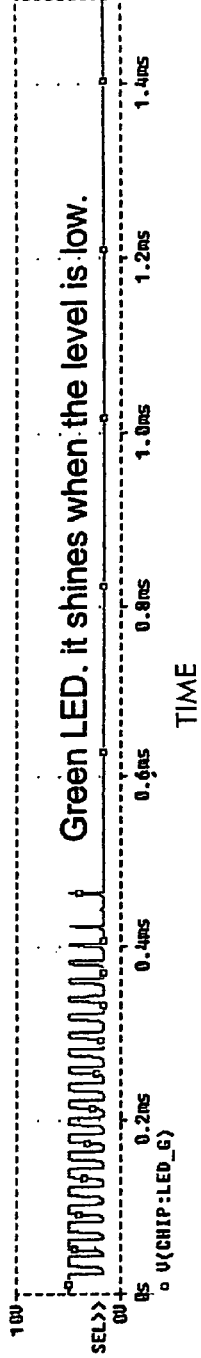

FIG. 3A shows the voltage across capacitor C1. FIG. 3B shows that initially, while the capacitor of C1 is charging, current pulse control (CPC) operation is provided. Otherwise, the current threshold may be exceeded by the inrush current. During this period of time, the MOSFET 14 source voltage is pulsed on for the time period determined by the CPC timer. FIG. 3C shows the MOSFET source voltage. FIG. 3D show the current in the shunt 16. FIG. 3E shows that the green LED is on when the MOSFET 14 is conducting (low level). FIG. 3D shows that the CPC operation keeps the current through the MOSFET at a safe level during the initial charging time.

In the event of a short circuit, FIG. 4 shows the operation of the circuit. As shown in FIG. 4A, the short circuit occurs after a certain time interval, after about 0.2 ms. The voltage across the load goes to substantially zero. The current through the shunt increases and the overload current is detected by the current limiting circuit 220. A CPC period is then commanded by circuit 220 (ILIML goes high) and the MOSFET 14 is pulsed on and off as shown in FIG. 3B during the CPC period which is not to exceed a preprogrammed time interval, as determined by the CPC timer. During this time interval, the green LED is pulsed on and off and at the end of the interval it is turned off. At the end of the interval, the red LED is turned on to indicate a default has occurred, as shown in FIG. 3D.

As shown in FIG. 4, a short circuit occurred at approximately 200 usec. after t=0. Immediately, a CPC period began. At the end of this period, the short circuit continued as shown in FIG. 3A, so the MOSFET 14 is turned off and the red LED is turned on.

In the event of an overload, a low resistance is placed across the load terminals but not necessarily a short circuit. FIG. 5F shows a typical overload simulation. FIG. 5A-E shows operation of the circuit. FIG. 5A shows the gate-source voltage of the MOSFET. The drain-source voltage is shown in FIG. 5B. FIG. 5C shows the voltage across the shunt. During the time period Tol, an overload has occurred. After the time Tol of an overload, the power MOSFET is switched off as shown by VGS going to zero in FIG. 5A. The green LED is turned off as shown in FIG. 5D and the red LED is turned on as shown in FIG. 5E.

FIG. 6 shows the operation of the circuit in response to a reset. FIG. 6A shows that two reset pulses have been applied. FIG. 6 shows how the reset push button works. The power MOSFET is switched off after an over-temperature default. To switch the MOSFET on again, the reset button is pushed twice. The first push will clear the default and the red LED will be turned off. The second one will turn the MOSFET on again and the green LED will light again, assuming no other faults have been detected.

FIG. 9 shows the operation of the overload timer TIMER_OL (230). Only an overload signal longer than 100 usecs will trigger a monostable multivibrator in this block. If it stays high longer than an externally programmed RC value, OL_DFT will go higher, signaling an overload and turning off FET 14.

There has thus been described an electronic fuse which simulates the operation of a thermal/mechanical fuse, but which allows resetting at the push of a button. The circuit uses current pulse control (CPC) to ensure that the current through the switching device never exceeds a preprogrammed threshold and further prevents damage to the switching device in the event current pulse control is requested at too frequent intervals.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An electronic fuse comprising:
   an integrated circuit having a control output terminal coupled to a control electrode of a power semiconductor switching device, the power semiconductor switching device being coupled in series with a load between first and second potentials;
   the integrated circuit further comprising a current sense input for sensing the current through the power semiconductor switching device;
   the integrated circuit further comprising a driver circuit for driving the power semiconductor switching device, the driver circuit being coupled to a current limiting circuit responsive to the sensed current in the power semiconductor switching device, the current limiting circuit controlling the driver circuit whereby if the current through the power semiconductor switching device exceeds a predetermined threshold, the current limiting circuit generates a command to pulsed the power semiconductor switching device on and off in a period of pulse operation to maintain the current in the power semiconductor switching device below a predetermined level;

further comprising a first timer circuit for limiting the period of pulsed operation to a preprogrammed first duration and further for controlling the power semiconductor switching device whereby if two commands to pulse the power semiconductor switching device are generated by the current limiting circuit within a duration less than a predetermined second duration, the power semiconductor switching device is turned off.

2. The electronic circuit of claim 1, wherein if said predetermined second duration is less than about 400 msec, the power semi-conductor switching device is turned off.

3. The circuit of claim 1, wherein said timer circuit generates a signal to turn off said power semiconductor switching device if two commands to pulse the power semiconductor switching device are generated within a duration less than said predetermined second duration.

4. The circuit of claim 1, further comprising a current overload detection circuit for detecting a current overload over a preprogrammed current level and generating an overload signal.

5. The circuit of claim 4, further comprising a second timer circuit responsive to the current overload detection circuit for detecting if a current overload exceeds a preprogrammed time and generating a fault signal to turn off the power semiconductor switching device.

6. The circuit of claim 1, further comprising a latch circuit responsive to the current limiting circuit and the first timer circuit for generating control signals to control operation of said semiconductor switching device.

7. The circuit of claim 6, wherein the latch circuit provides said control signals to a driver circuit for driving said power semiconductor switching device.

8. The circuit of claim 1, wherein the current limiting circuit has a current sensing circuit coupled to sense current through the power semiconductor switching device.

9. The circuit of claim 8, wherein the current sensing circuit is coupled to a current shunt resistor coupled in series with the power semiconductor switching device and the load.

10. The circuit of claim 1, further comprising a reset actuator for resetting functions of the integrated circuit in the event of an overload current in said power semiconductor switching device.

11. The circuit of claim 1, further comprising an over-temperature protection circuit for detecting an excessive temperature of said power semiconductor switching device and for generating a control signal to turn off the power semiconductor switching device.

12. The circuit of claim 1, wherein the power semiconductor switching device comprises a MOSFET.

* * * * *